United States Patent
McCune, Jr. et al.

(10) Patent No.: US 10,680,563 B2
(45) Date of Patent: Jun. 9, 2020

(54) LOW WIDEBAND NOISE MULTI-STAGE SWITCH-MODE POWER AMPLIFIER

(71) Applicant: Eridan Communications, Inc., Santa Clara, CA (US)

(72) Inventors: Earl W McCune, Jr., Santa Clara, CA (US); Quentin Diduck, Santa Clara, CA (US)

(73) Assignee: Eridan Communications, Inc., Mountain View, CA (US)

( * ) Notice: Subject to any disclaimer, the term of this patent is extended or adjusted under 35 U.S.C. 154(b) by 0 days.

(21) Appl. No.: 15/985,921

(22) Filed: May 22, 2018

(65) Prior Publication Data
US 2018/0342991 A1    Nov. 29, 2018

Related U.S. Application Data

(60) Provisional application No. 62/509,859, filed on May 23, 2017.

(51) Int. Cl.
| | |
|---|---|
| *H03F 3/193* | (2006.01) |
| *H03F 3/217* | (2006.01) |
| *H03F 3/45* | (2006.01) |
| *H02M 3/325* | (2006.01) |
| *H02M 1/32* | (2007.01) |

(Continued)

(52) U.S. Cl.
CPC ............ *H03F 3/193* (2013.01); *H02M 1/32* (2013.01); *H02M 1/36* (2013.01); *H02M 3/156* (2013.01); *H02M 3/33507* (2013.01); *H03F 1/0222* (2013.01); *H03F 3/2171* (2013.01);

(Continued)

(58) Field of Classification Search
USPC ..... 330/264, 296–298, 285, 149, 251, 207 A
See application file for complete search history.

(56) References Cited

U.S. PATENT DOCUMENTS

| | | | |
|---|---|---|---|
| 9,118,283 B2* | 8/2015 | Buisman | H03F 3/2171 |
| 9,397,621 B2 | 7/2016 | McCune, Jr. | |

(Continued)

OTHER PUBLICATIONS

Mahalawy et al., "An All-GaN Differential Driver for a 60 V GaN-Based Power Amplifier with 1 GHz Switching Freguency," Wireless and Microwave Technology Conference (WAMICON), 2014 IEEE 15 Annual, pp. 1-3, Jun. 2014.

*Primary Examiner* — Hieu P Nguyen
(74) *Attorney, Agent, or Firm* — Patent Law Professionals, P.C.; William E. Winters

(57) ABSTRACT

A multi-stage radio frequency power amplifier (RFPA) includes an output stage SMPA and a driver stage SMPA. As the multi-stage RFPA operates, the magnitude of an RF switch drive signal generated by the driver stage SMPA is dynamically minimized based on I-V characteristic curves of the output stage SMPA's power transistor and the output stage SMPA's dynamically changing load line. By constraining the magnitude of the RF switch drive signal as the multi-stage RFPA operates, VGS feedthrough of the RF switch drive signal is minimized, to the extent possible. Amplitude distortion and phase distortion in the RF output that might occur due to unconstrained VGS feedthrough, particularly at low output RF power levels, are therefore avoided. Operating all stages of the multi-stage RFPA in switch mode also results in high energy efficiency and an output RF spectrum with very low wideband noise (WBN).

18 Claims, 9 Drawing Sheets

(51) Int. Cl.
*H02M 1/36* (2007.01)
*H02M 3/335* (2006.01)
*H02M 3/156* (2006.01)
*H03F 1/02* (2006.01)

(52) U.S. Cl.
CPC ......... *H03F 3/45* (2013.01); *H03F 2200/102* (2013.01); *H03F 2200/405* (2013.01); *H03F 2200/451* (2013.01)

(56) References Cited

U.S. PATENT DOCUMENTS

| | | | |
|---|---|---|---|
| 9,559,883 B2 * | 1/2017 | Eliezer | ................ H04L 25/4902 |
| 2008/0129382 A1 | 6/2008 | Outaleb et al. | |
| 2012/0139589 A1 | 6/2012 | Machida et al. | |

* cited by examiner

LOW WIDEBAND NOISE MULTI-STAGE SWITCH-MODE POWER AMPLIFIER

CROSS-REFERENCE TO RELATED APPLICATIONS

This application claims the benefit of U.S. Provisional Patent Application No. 62/509,859, filed on May 23, 2017.

BACKGROUND OF THE INVENTION

Radio frequency power amplifiers (RFPAs) are used to translate RF signals, such as a modulated RF carrier in an RF transmitter, to higher RF powers. Often an RFPA will not have sufficient power gain to translate the low-power RF input signal to the desired or needed RF power. To address this limitation, RFPAs are often constructed from two or more RFPAs (or "stages"), as illustrated in FIG. 1. The total power gain G of the multi-stage RFPA 100 is determined by the product of the power gains of all of its N individual stages, where N denotes the number of stages. In other words, $G=G1 \times G2 \times \ldots GN$, where G1, G2 and GN are the power gains of the individual stages PA-1, PA-2, and PA-N, respectively. When expressed in decibels (dB), the total power gain G(dB) is the sum of the individual power gains, in other words, $G(dB)=G1(dB)+G2(dB)+ \ldots +GN(dB)$.

The multi-stage RFPA 100 translates its input RF signal RFIN to higher RF power using direct current (DC) energy supplied to it from one or more external DC power supplies (indicated by the DC power supply voltages VDD1, VDD2, ..., VDDN in FIG. 1). To best maintain linearity, its various stages PA-1, PA-2, ..., PA-N are configured to operate as Class A, B or AB amplifiers. Unfortunately, these so-called "linear" RFPAs are very energy inefficient. Instead of converting all of the DC energy they receive into useful output RF power, they convert a large percentage of it into heat. Energy efficiency of any given stage is especially low during times the magnitude of its input RF signal is low, and particularly problematic in circumstances where the input RF signal RFIN is amplitude modulated. To prevent the peaks of any amplitude-modulated input RF signal from being clipped (i.e., to avoid loss of linearity and prevent distortion) as the input RF signal RFIN is amplified by the various stages PA-1, PA-2, ..., PA-N, the output RF powers of one or more of the RFPA stages PA-1, PA-2, ..., PA-N must be "backed off" Unfortunately, while backing off the output RF powers does help to maintain linearity, it further lowers the energy efficiency of the multi-stage RFPA 100.

Another problem with the multi-stage RFPA 100 is that it produces a significant amount of wideband noise (WBN). Mathematically, WBN can be expressed as follows: $WBN(dB)=kT(dB)+G(dB)+NF(dB)$, where k is Boltzmann's constant ($1.38 \times 10^{-23}$ J/K), T is the absolute temperature of the RFPA's load in kelvins, G is the overall power gain of the multi-stage RFPA 100, and NF denotes what is known as the "noise figure." The lower limit of WBN in any environment is determined by what is known as "thermal noise" (or "Johnson-Nyquist" noise), and is quantified by the "kT(dB)" term in the WBN formula. Thermal noise is generated by the agitation of charge carriers (electrons) present in electrical conductors, and is a type of "white" noise, meaning that its power spectral density is nearly constant across the frequency spectrum.

Thermal noise is usually modeled using a voltage source that represents the noise of a non-ideal resistor connected in series with an ideal noise-free resistor. According to this model, the "thermal noise power" generated by the non-ideal resistor is: $P(dB)=10 \log(kTB)$, where B is the bandwidth in hertz (Hz) over which the thermal noise is being considered. At room temperature (290K/17° C.), the thermal noise power in a B=1 Hz bandwidth is −174 dBm/Hz (where dBm means the decibel value is referenced to 1 milliwatt). Knowing this number, the "thermal noise floor" can be computed for any arbitrary channel bandwidth. For example, the thermal noise floor for the 200 kHz channel bandwidth used in the Global System for Mobile (GSM) communications standard is $-174$ dBm/Hz+10 log(200 kHz)=$-121$ dBm. This number represents the lowest noise power obtainable in a 200 kHz GSM channel.

The other two contributors to WBN, aside from kTB thermal noise, are the power gain G(dB) and noise figure NF(dB). Both operate to raise the noise floor above the kTB thermal noise floor. This effect on the WBN is illustrated in FIG. 2. The reason that the gain G(dB) affects the WBN is that every one of the various stages PA-1, PA-2, ..., PA-N in the multi-stage RFPA 100 that has a positive, non-zero (in dB) gain not only translates its associated input RF signal to higher RF power, it/they also amplify(ies) any noise present at its/their inputs to higher power. Moreover, because the stages PA-1, PA-2, ..., PA-N are not ideal devices and are themselves sources of noise, their mere presence increases WBN above the kTB thermal noise floor. These additional sources of noise are accounted for in the WBN formula above by the noise figure NF.

By definition, NF is a measure of how much a device (for example, an RFPA or a receiver) degrades the signal-to-noise ratio (SNR). In other words, $NF=10 \log(SNR_{input}/SNR_{output})$. NF is an intrinsic property of the physical device under consideration, and is a concept that is applicable to essentially any RF device or RF signal chain, including the multi-stage RFPA 100 depicted in FIG. 1. Because the SNR at the output of each stage PA-1, PA-2, ..., PA-N is always smaller than the SNR at its input ($SNR_{output} < SNR_{input}$), the NF of each stage, as well as the overall NF of the multi-stage RFPA 100, is always a positive number, i.e., can never be zero or negative. (Note that the NF term in the WBN formula above represents the overall NF of the multi-stage RFPA 100 and is determined by the individual NFs and gains G of all stages PA-1, PA-2, ..., PA-N.)

Since at least one of the stages PAs PA-1, PA-2, ..., PA-N of the multi-stage RFPA 100 must have a power gain greater than 0 dB (in order to translate the input RF signal to higher RF power), and because the multi-stage RFPA 100 always has a non-zero NF, as highlighted in the level diagram in FIG. 2, achieving low WBN in the output RF spectrum of the multi-stage RFPA 100 is often not possible. In some circumstances the WBN can be so high that it is impossible to satisfy the spectral mask requirements specified by an applicable communications standard. In other circumstances the WBN is so excessive that it completely swamps a proximate receive band (RX), as illustrated in FIG. 3.

BRIEF SUMMARY OF THE INVENTION

A multi-stage radio frequency power amplifier (RFPA) and a method of its operation are disclosed. The multi-stage RFPA comprises a plurality of switch-mode power amplifiers (SMPA), including an output stage SMPA and a driver stage SMPA. As the multi-stage RFPA operates, the magnitude of an RF switch drive signal generated by the driver stage SMPA is dynamically minimized based on I-V characteristic curves of the output stage SMPA's power transistor and the output stage SMPA's dynamically changing load line. By constraining the magnitude of the RF switch drive signal as the multi-stage RFPA operates, VGS feedthrough of the RF switch drive signal is minimized, to the extent possible. Amplitude distortion and phase distortion in the RF output that might occur due to unconstrained VGS feedthrough, particularly at low output RF power levels, are therefore avoided. Operating all stages of the multi-stage RFPA in switch mode also results in high energy efficiency and an output RF spectrum with very low wideband noise (WBN).

Further features and advantages of the invention, including a detailed description of the above-summarized and other exemplary embodiments of the invention, will now be described in detail with respect to the accompanying drawings, in which like reference numbers are used to indicate identical or functionally similar elements.

DETAILED DESCRIPTION

Figure 4:
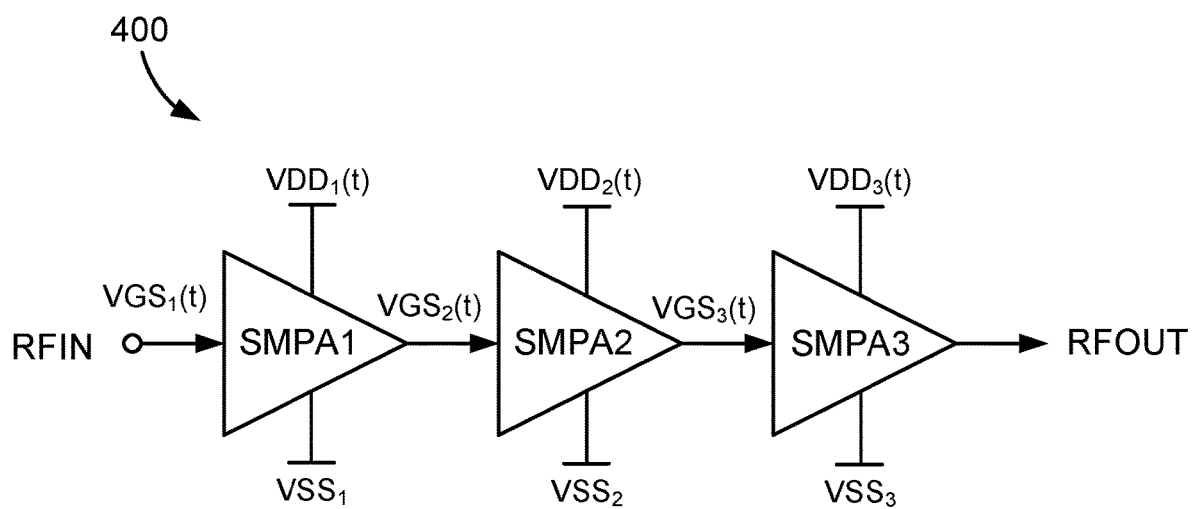
FIG. 4 is a drawing of a multi-stage radio frequency power amplifier (RFPA), according to an embodiment of the present invention.

Referring to FIG. 4, there is shown a multi-stage radio frequency power amplifier (RFPA) 400, according to one embodiment of the present invention. The multi-stage RFPA 400 comprises a plurality of switch-mode power amplifiers (SMPAs), three in this exemplary embodiment labeled SMPA1, SMPA2 and SMPA3. As their names suggest, each of the SMPAs: SMPA1, SMPA2 and SMPA3 is configured to operate as a switch, unlike the linear PAs: PA-1, PA-2, . . . , PA-N of the multi-stage RFPA 100 described above in reference to FIG. 1 which operate as controlled current sources (i.e., "linear" PAs). Further, each of the SMPAs: SMPA1, SMPA2 and SMPA3 is configured to operate in the polar domain, in response to amplitude-modulated power supply voltages $VDD_1(t)$, $VDD_2(t)$, and $VDD_3(t)$ applied to their respective power supply ports and square waveform angle-modulated switch drive signals $VGS_1(t)$, $VGS_2(t)$, and $VGS_3(t)$ applied to their RF input ports. In the description that follows, it is assumed that both the amplitude and angle (frequency or phase) of the RF carrier passing through the multi-stage RFPA 400 are modulated. While many modern modulation schemes employ such complex modulation schemes, insofar as the present invention is concerned that need not be the case. In other words, the present invention is also applicable to applications in which only the amplitude of the RF carrier is modulated (no angle modulation) or in which only the angle of the RF carrier is modulated (no amplitude modulation).

Figure 5:
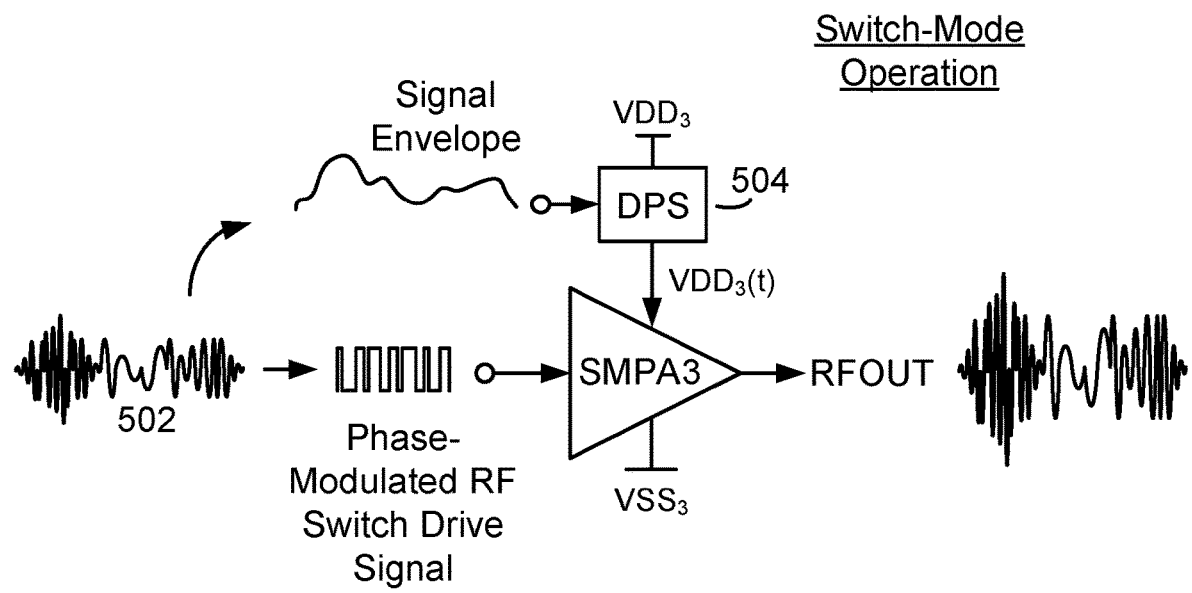
FIG. 5 is a drawing that illustrates the basic polar modulation and switching operation of the final switch-mode power amplifier (SMPA) stage of the multi-stage RFPA depicted in FIG. 4, according to one embodiment of the present invention.
Figure 6:
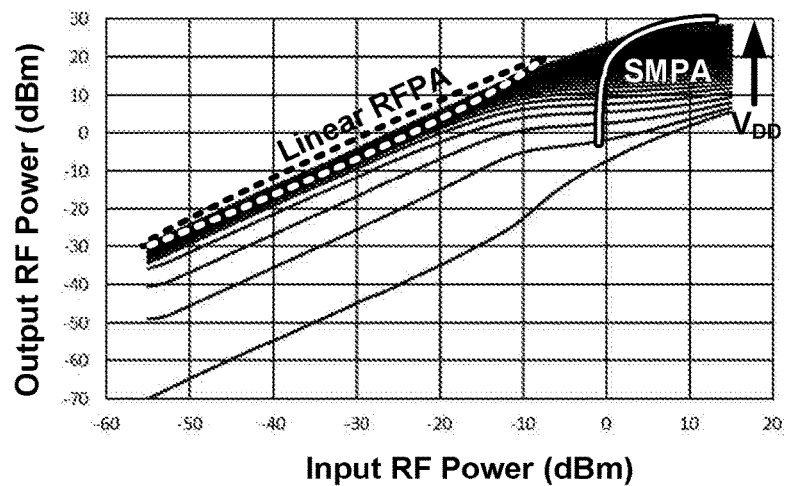
FIG. 6 is a Booth Chart showing how the output RF power of a linear PA depends on the magnitude of its gate drive signal and how the output RF power of an SMPA depends on the magnitude of its power supply voltage VDD, not on the magnitude of its gate drive signal.

FIG. 5 is a drawing that illustrates the basic polar modulation and switching operation of one of the stages of the multi-stage RFPA 400, specifically, final stage SMPA3. A complex modulated RF carrier is presented to the SMPA3 in the polar domain as two separate components. Specifically, an amplitude-modulated component defining the signal envelope of the input RF signal 502 is applied to a control input of a dynamic power supply (DPS) 502, which responds by producing a DPS voltage $VDD_3(t)$ for the SMPA3. Meanwhile, an angle-modulated RF switch drive signal (which preferably has a bi-level or square-wave-like waveform) is applied to the RF input port of the SMPA3. As the DPS voltage $VDD_3(t)$ is applied to the power supply port of the SMPA3, the angle-modulated RF switch drive signal causes the SMPA3 to switch ON and OFF within each carrier frequency cycle, between compressed and cut-off states, depending on the high and low levels of the RF switch drive signal. The output RF power of an SMPA is determined by the magnitude of its DPS voltage VDD, or more specifically by the square of its DPS voltage (i.e., $Pout(RF) \propto VDD^2$). Accordingly, the amplitude modulation (AM) carried in the DPS voltage $VDD_3(t)$ is reformed into the RF output signal RFOUT as the SMPA3 translates the input RF signal RFIN to higher RF power. In contrast, since linear PAs (like the linear PAs PA-1, PA-2, . . . , PA-N of the multi-stage RFPA 100 discussed above in reference to FIG. 1) operate as controlled current sources, the magnitudes of their RF outputs depend on the magnitudes of their respective gate drive signals and not on the magnitudes of their supply voltages. This difference in output RF power dependency can be seen in the Booth Chart shown in FIG. 6, where it is seen that the output RF power of a linear PA depends on the magnitude of its gate drive signal but the output RF power of an SMPA is independent of (for the most part) the magnitude of its switch drive signal, instead depending on the DPS voltage VDD.

Figure 7:
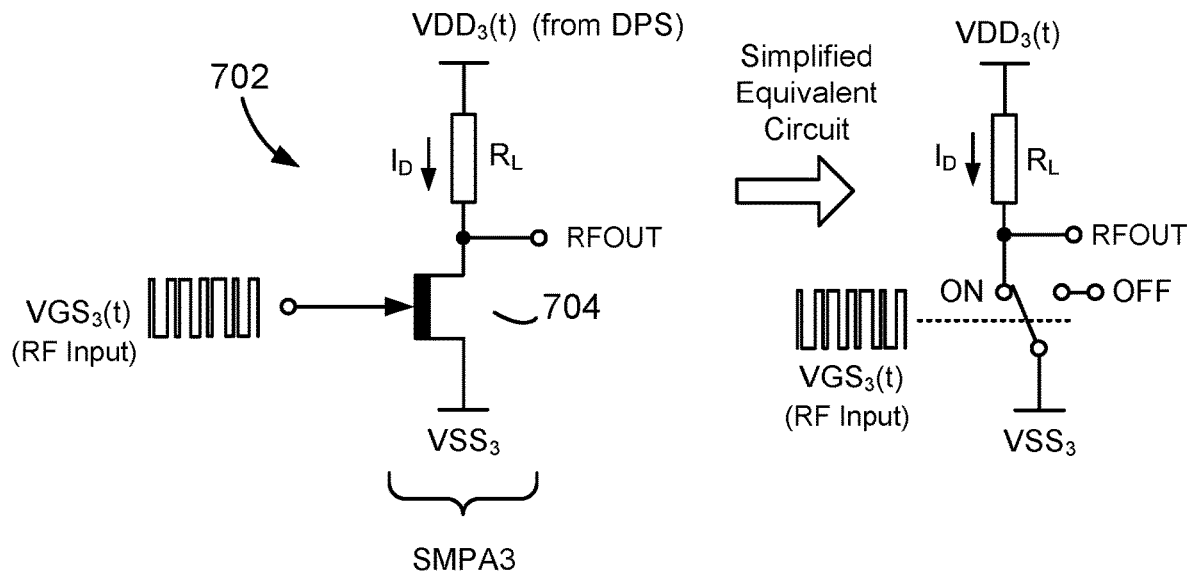
FIG. 7 is a simplified schematic drawing of a SMPA, which may be used to implement the SMPA stages of the multi-stage RFPA depicted in FIG. 4.

Each of the SMPAs: SMPA1, SMPA2 and SMPA3 of the multi-stage RFPA 400 can be implemented in various ways and each may be configured to operate according to any switch-mode class of SMPAs, including Class D, E, or F. FIG. 7 illustrates one possible SMPA implementation that employs a single power transistor 704, such as for Class E or F operation. (Note that this exemplary implementation is for the final stage SMP3 with a load $R_L$, which may be the load resistance of an antenna, for example. The preceding stages could be similarly designed.) According to this exemplary SMPA 702, the gate of the power transistor 704 is driven by the angle-modulated RF switch drive signal $VGS_3(t)$. Responding to this RF switch drive signal $VGS_3(t)$, the power transistor 704 (which can be modeled as an ON/OFF switch as shown in the drawing) either blocks (switch OFF) or allows drain current $I_D$ to flow (switch ON). Although not shown in the drawing, the exemplary SMPA 702 also preferably includes an output filter that shapes the drain voltage and drain current waveforms so they have no (or very little) overlap in time. By shaping the drain voltage and drain current waveforms so that they do not overlap, the SMPA 702 can be made to be substantially more energy efficient than any one of the linear PAs PA-1, PA-2, . . . , PA-N used in the multi-stage RFPA 100 described above in reference to FIG. 1.

It should be mentioned that the transistor symbol used to depict the power transistor 704 in FIG. 7 is the symbol commonly used to indicate a depletion mode field-effect transistor (FET). That symbol is used in the drawing since in a preferred embodiment of the invention, a gallium nitride (GaN) high electron mobility transistor (GaN-HEMT)—a depletion mode FET—is used for the power transistor 704. However, it should be emphasized that the SMPAs of the multi-stage RFPA 400 are not limited to any particular type of transistor. For example, the power transistor 704 of the output stage SMPA3 and the transistors used in preceding SMPA stages SMPA1 and SMPA2 could be implemented using silicon (Si) enhancement mode metal-oxide-semiconductor FETs (MOSFETs). Or a combination of Si MOSFETs and III-nitride based FETs could be used, for example, the output stage SMPA3 using a GaN-HEMT and the preceding stages SMPA1 and SMPA2 using Si MOSFETs.

Figure 8:
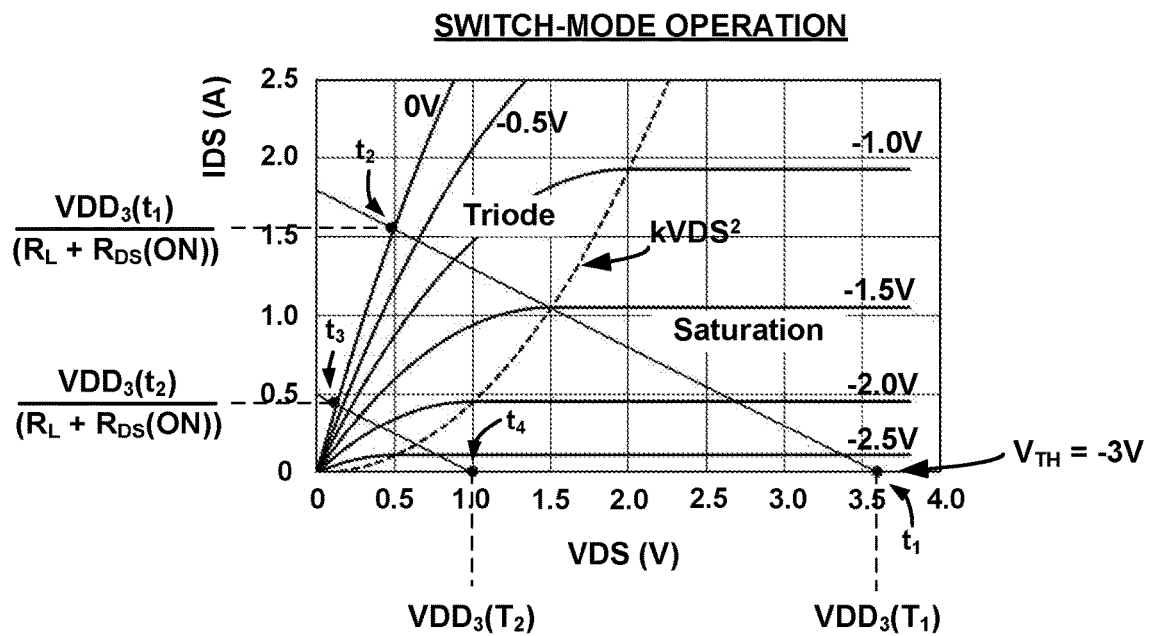
FIG. 8 is a drawing of the drain current v. drain voltage characteristic curves (I-V characteristic curves) of the power transistor in the SMPA depicted in FIG. 7, along with two different load lines of the SMPA superimposed over the I-V characteristic curves for two different time spans $T_1$ and $T_2$.

FIG. 8 is a drawing of the drain current v. drain voltage characteristics (I-V characteristics) of the power transistor 704 of the SMPA 702. The I-V curves further illustrate the switch-mode operation of the SMPA 702 and how its load line changes over time depending on its dynamically changing DPS voltage $VDD_3(t)$. During a first time span $T_1$: $t_2 < t < t_2$, which may represent, for example, one period of the RF switch drive signal $VGS_3(t)$, the DPS voltage $VDD_3(t)$ applied to the drain of the power transistor 704 has a magnitude $VDD_3(T_1)$. At time $t=t_1$, the RF switch drive signal $VGS_3(t)$ is at its high-magnitude level, thus causing the power transistor 704 to compress and switch fully ON. Subsequently, at $t=t_2$, the RF switch drive signal $VGS_3(t)$ drops to its low-magnitude level (which is lower than the threshold voltage $V_{th}$ of the power transistor 704), causing the power transistor 704 to enter the cut-off region of its I-V characteristic curves and switch OFF. Subsequent to the first time period $T_1$: $t_1 < t < t_2$ and during a second time period $T_2$: $t_3 < t < t_4$, the DPS voltage $VDD_3(t)$ being applied to the drain of the power transistor 704 is reduced to a lower magnitude $VDD_3(T_2)$, as dictated by the AM being carried by the DPS voltage $VDD_3(t)$. At time $t=t_3$, the RF switch drive signal $VGS_3(t)$ is at its high-magnitude level, which causes the power transistor 704 to once again compress and switch ON. Finally, at time $t=t_4$, the RF switch drive signal $VGS_3(t)$ transitions to its low-magnitude level, causing the power transistor 704 to enter the cut-off region and switch OFF.

Since the switch-mode output RF power produced by the SMPA 702 is proportional to the square of the magnitude of the DPS voltage $VDD_3(t)$, the output RF power produced by the SMPA 702 during the second time period $T_2$: $t_3 < t < t_4$ is lower than the output RF power produced by the SMPA 702 during the first time period $T_1$: $t_1 < t < t_2$. The change from high output RF power during the first time period $T_1$: $t_1 < t < t_2$ (when the DPS voltage $VDD_3(t) = VDD_3(T_1)$) to lower output RF power during the time period $T_2$: $t_3 < t < t_4$ (when the DPS voltage $VDD_3(t) = VDD_3(T_2)$) thus illustrates the "drain modulation" property of the SMPA 702, including how the load line of the SMPA 702 dynamically changes over time depending on the magnitude of the DPS voltage $VDD_3(t)$. Further details concerning polar operation can be found in E. McCune, *Dynamic Power Supply Transmitters—Envelope Tracking, Direct Polar, and Hybrid Combinations*, Cambridge University Press (2015), which is incorporated herein by reference for all purposes.

Figure 1:
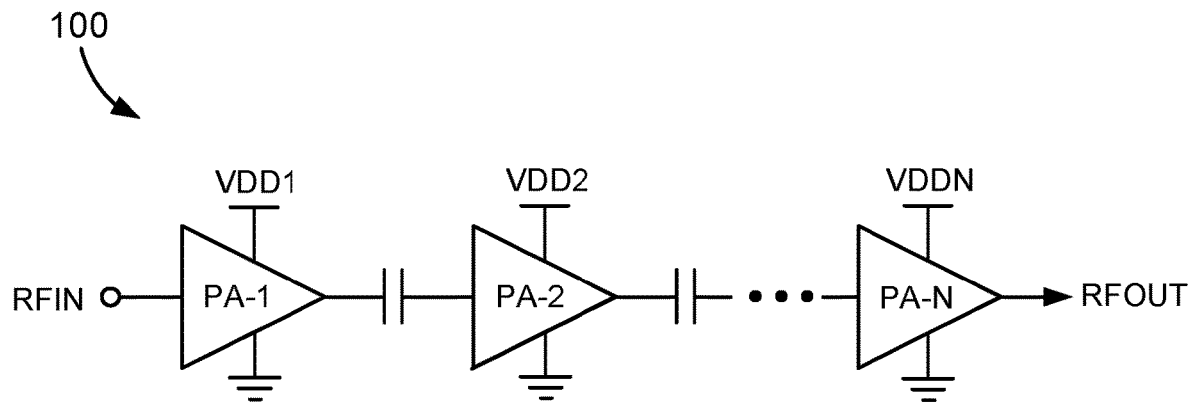
FIG. 1 is a drawing of a multi-stage radio frequency power amplifier (RFPA) constructed from a plurality of linear PA stages.
Figure 2:
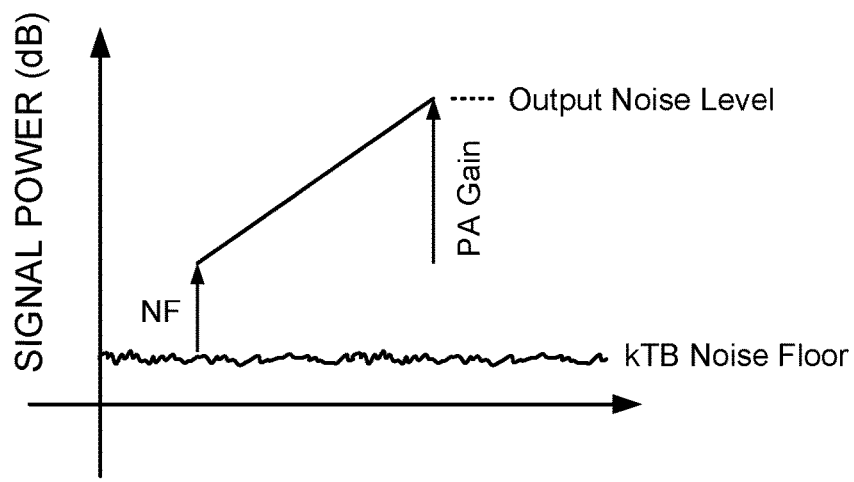
FIG. 2 is a level diagram that illustrates how the power gain (G) and noise figure (NF) of the multi-stage RFPA depicted in FIG. 1 operate to raise the noise level in the RFPA's RF output spectrum above the kTB thermal noise floor.
Figure 3:
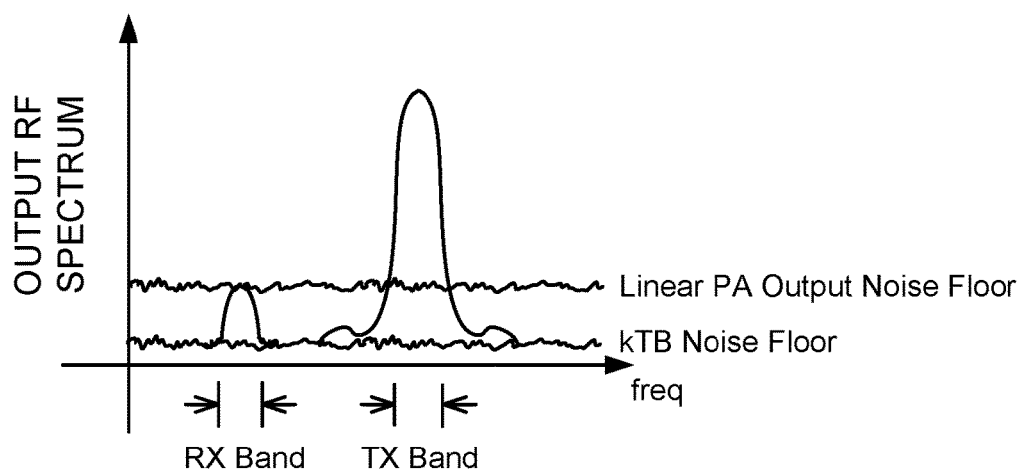
FIG. 3 is a diagram illustrating how excessive wideband noise in the output RF spectrum of the multi-stage RFPA depicted in FIG. 1 can completely swamp a proximate receive band (RX)
Figure 9:
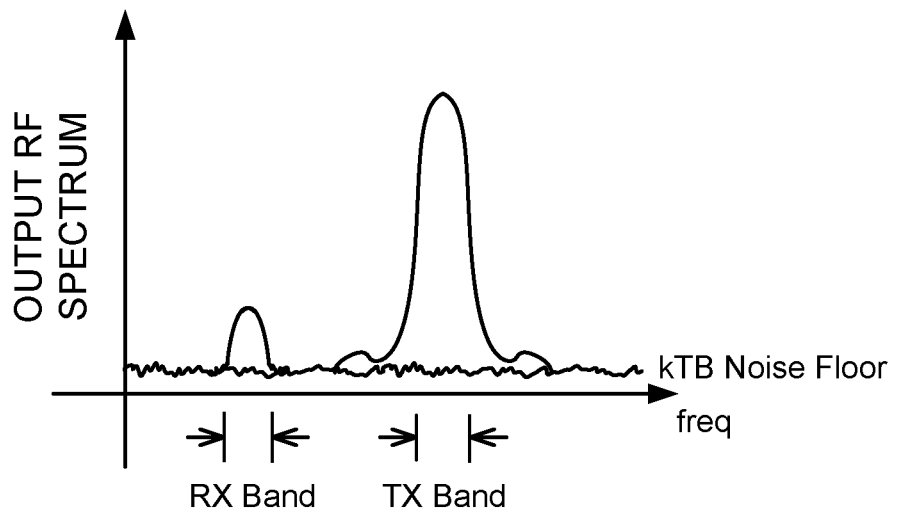
FIG. 9 is a drawing of the output RF spectrum of the multi-stage RFPA depicted in FIG. 4, highlighting how the WBN is low, very near the kTB thermal noise floor, and sufficiently low that it does not interfere with or swamp a proximate receive band RX.

In addition to being substantially more energy efficient than the linear-PA-based multi-stage RFPA 100 depicted in FIG. 1, the multi-stage RFPA 400 does not produce an output RF spectrum having as much wideband noise (WBN). As was explained above in describing the linear-PA-base multi-stage RFPA 100, WBN can be mathematically expressed as: $WBN(dB)=kT(dB)+G(dB)+NF(dB)$. The power gain G for each of the SMPA stages SMPA1, SMPA2, and SMPA3 of the multi-stage RFPA 400 can be written as the sum of the slope gains of the SMPAs: SMPA1, SMPA2, and SMPA3, in other words: $g_{s1}=g_{m1} \times R_{L,1}$, $g_{s2}=g_{m2} \times R_{L,2}$, and $g_{s3}=g_{m3} \times R_{L,3}$, where $R_{L,1}$, $R_{L,2}$, and $R_{L,3}$ represent the load resistances presented to each stage and $g_{m1}$, $g_{m2}$, and $g_{m3}$ are the transconductances of the SMPA stages SMPA1, SMPA2, SMPA3. Because the transconductances $g_{m1}$, $g_{m2}$ and $g_{m3}$ are very small in an SMPA (ideally zero), the noise gain is also very near zero. This holds true even though the multi-stage RFPA 400 has a non-zero overall ratiometric power gain of G(dB)=G1(dB)+G2(dB)+G3(dB). As a result, and as illustrated in FIG. 9 (compare to FIG. 3), the noise floor at the RF output of the multi-stage RFPA 400 is not significantly higher than the kTB thermal noise floor limit. Indeed, using a linear-PA noise analysis, it can be shown that the multi-stage RFPA 400 has an "effective" noise figure $N_{eff}$ that is actually negative in value. Consider, for example, a situation where each SMPA: SMPA1, SMPA2 and SMPA3 has a NF of 5 dB and the multi-stage RFPA 400 has an overall ratiometric power gain of $G_{total}$(dB)=33 dB. In such a situation, the effective noise figure $N_{eff}$ of the multi-stage SMPA would be: (kT+3)−33−kT=−30 dB. Such a result is physically impossible with any linear RFPA 100.

Figure 10:
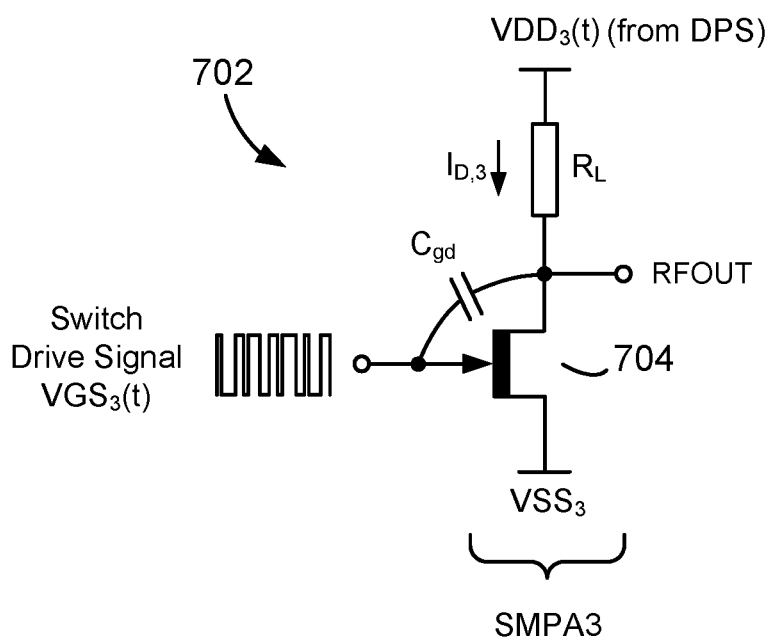
FIG. 10 is a drawing highlighting how a power transistor in the SMPA depicted in FIG. 7 includes a parasitic gate-drain capacitor $C_{gd}$ between its gate and drain.
Figure 11:
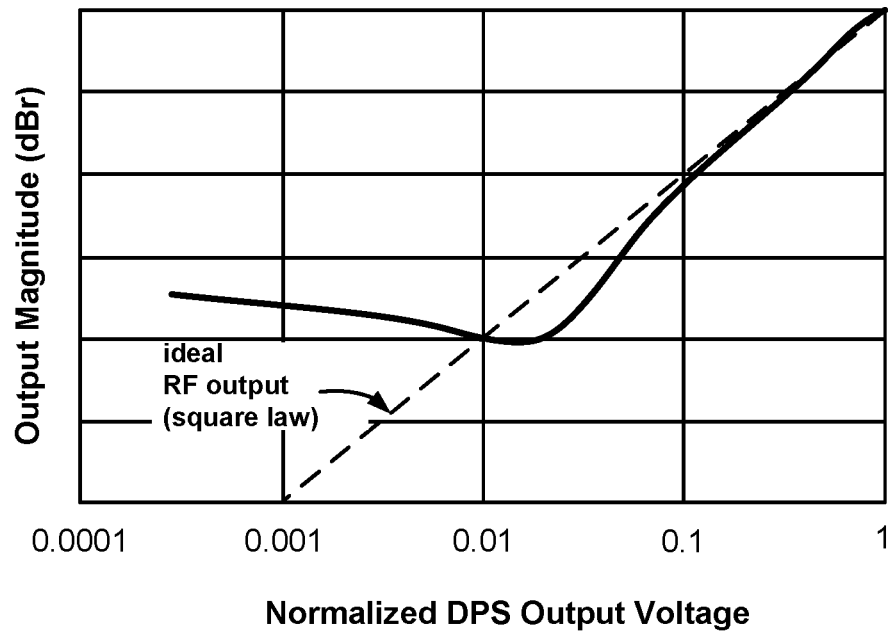
FIG. 11 is a drawing that illustrates how VGS feedthrough through the parasitic gate-drain capacitor $C_{gd}$ of an SMPA can cause amplitude distortion in the output RF signal of an SMPA, especially during times when the SMPA's DPS output voltage is low.
Figure 12:
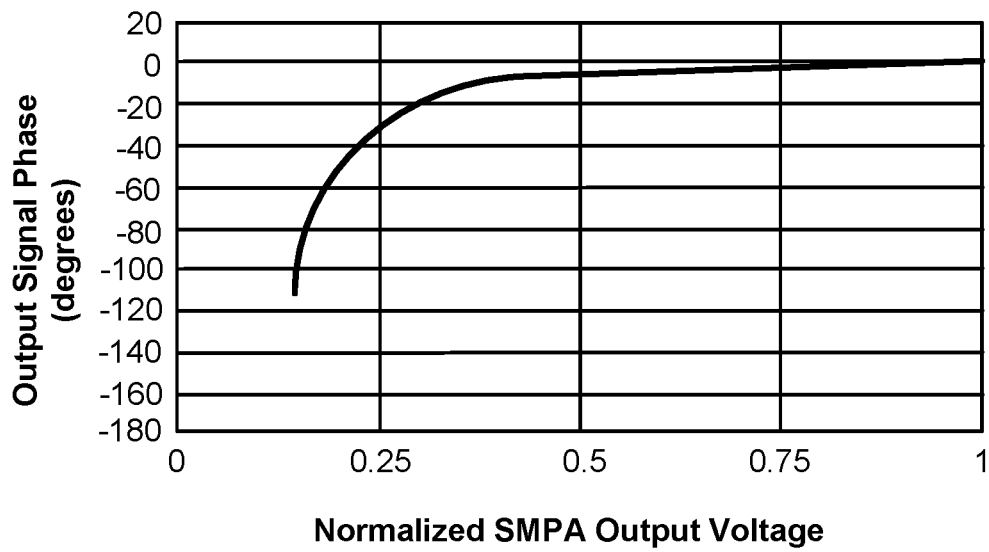
FIG. 12 is a drawing that illustrates how VGS feedthrough through the parasitic gate-drain capacitor $C_{gd}$ of an SMPA can cause phase distortion in the output RF signal of an SMPA, especially during times when the SMPA output RF voltage is low.
Figure 13:
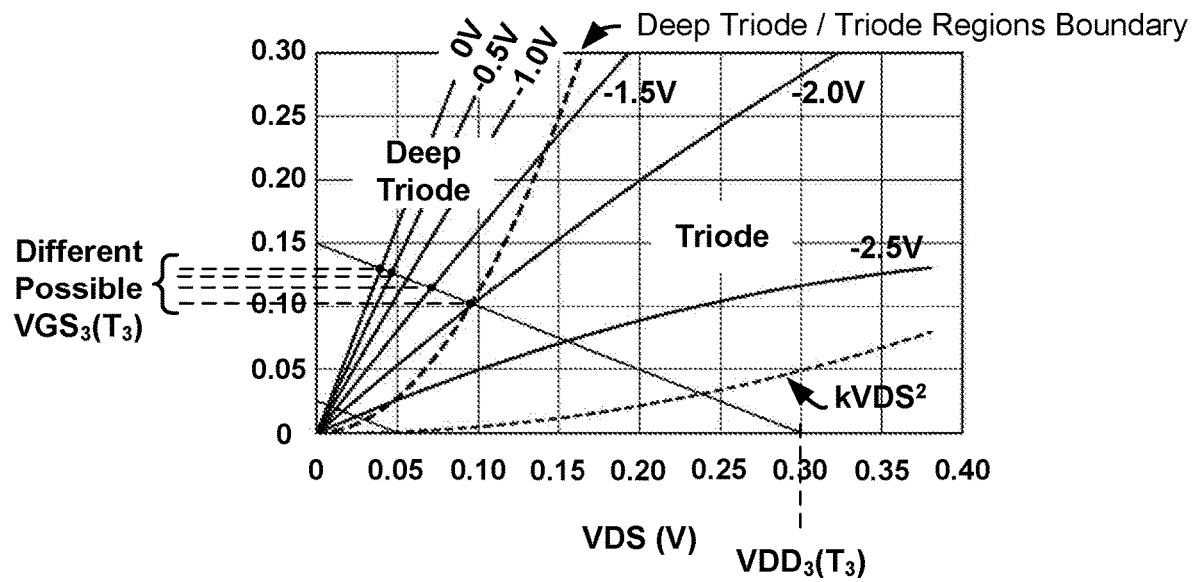
FIG. 13 is a zoomed in version of the I-V curves depicted in FIG. 8, highlighting the curves at very low voltages and currents and revealing the deep triode region and its boundary with the triode region.

Although the multi-stage RFPA 400 overcomes the low energy efficiency problem of the linear-PA-based multi-stage RFPA 100 and produces significantly less WBN in its output RF spectrum, it has one significant problem which if not addressed can lead to undesirable amplitude and phase distortion in its RF output signal. Each SMPA stage: SMPA1, SMPA2, and SMPA3 of the multi-stage RFPA 400 has a parasitic capacitor $C_{gd}$ connected between the gate and drain of its associated power FET, as illustrated in FIG. 10. These parasitic gate-drain capacitors $C_{gd1}C_{gd2}$, and $C_{gd3}$ provide paths or "feedthroughs" through which the RF switch drive signals $VGS_1(t)$, $VGS_2(t)$ and $VGS_3(t)$ can leak as the multi-stage RFPA 400 operates. As shown in FIGS. 11 and 12, this VGS feedthrough problem, if not addressed, can cause significant amplitude and phase distortion, especially when the magnitudes of the DPS voltages $VDD_1(t)$, $VDD_2(t)$ and $VDD_3(t)$ and output RF power of the multi-stage RFPA 400 are low. In accordance with one embodiment of the invention, the magnitudes of the input gate-source voltage signals $VGS_1(t)$, $VGS_2(t)$ and $VGS_3(t)$ and the magnitudes of the power supply voltages $VDD_1(t)$, $VDD_2(t)$ and $VDD_3(t)$ are controlled in a manner that minimizes this VGS feedthrough problem. To better understand how this is accomplished, it is helpful to first refer to FIG. 13, which is the same set of I-V characteristic curves shown in FIG. 8, but zoomed in to highlight the curves at very low voltages and currents. This zoomed-in version of the curves reveals what may be referred to as the "triode" and "deep triode regions" of operation of the SMPA 702. As was previously observed in reference to the Booth Chart in FIG. 6, the output RF power of the SMPA3 depends on the square of the magnitude of its power supply voltage $VDD_3(t)$ and is independent of (or nearly independent of) the magnitude of its switch drive signal $VGS_3(t)$. This independence of the output RF power (which is determined by the drain-source current $ID_3(t)$) on the magnitude of the switch drive signal $VGS_3(t)$ can also be observed in the zoomed in I-V characteristic curves in FIG. 13. For example, along the upper load line, a change in magnitude of $VGS_3$ from −2.0V to 0V (a large difference of 2V) results in a change in $IDS_3$ of only about 30 mA. This very small change in drain current substantiates the fact that the output RF power of the SMPA 702 is essentially independent of the magnitude of $VGS_{3,H}$. With this observation, the magnitude of $VGS_{3,H}$ can be reduced substantially to minimize VGS feedthrough and with negligible effect on the output RF power and, importantly, without losing switch-mode operation. Maintaining switch-mode operation is important, particularly because of the substantial energy efficiency switch-mode operation brings. Furthermore, the observed near independence of the output RF power on the magnitude of $VGS_3$ affords the ability to select a magnitude of $VGS_{3,H}(t)$ for each change in $VDD_3$, i.e., along each corresponding VDD-dependent load line, that is just necessary to maintain switch-mode operation. According to one embodiment of the invention, the value of $VGS_{3,H}(t)$ selected for each load line is the value of $VGS_3$ that falls just inside the deep triode region as measured from the deep triode/triode region boundary. By selecting $VGS_{3,H}(t)$ for each VDD-dependent load line over time, leakage of $VGS_{3,H}(t)$ through SMPA3's parasitic gate-drain capacitor $C_{gd3}$ (VGS feedthrough) is therefore minimized, to the extent possible.

Figure 14:
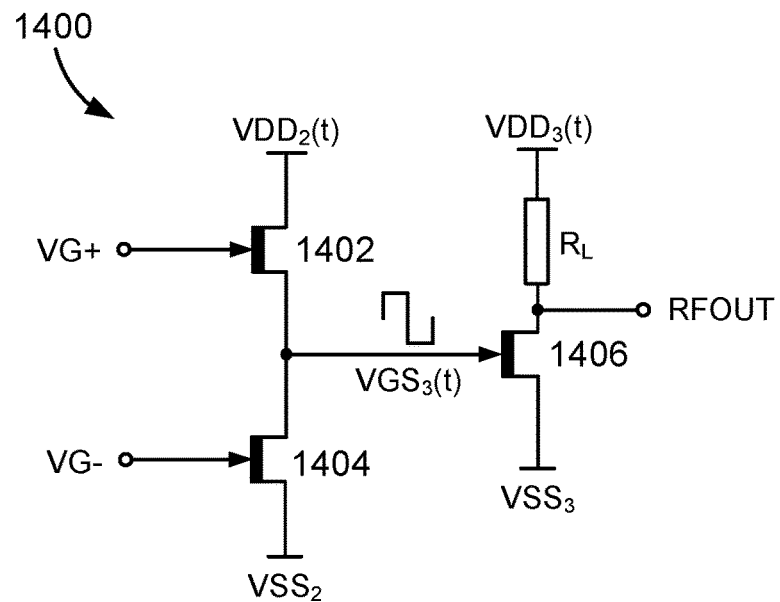
FIG. 14 is a schematic drawing illustrating one way that the second and third SMPA stages of the multi-stage RFPA depicted in FIG. 4 can be implemented, according to one embodiment of the present invention.
Figure 15:
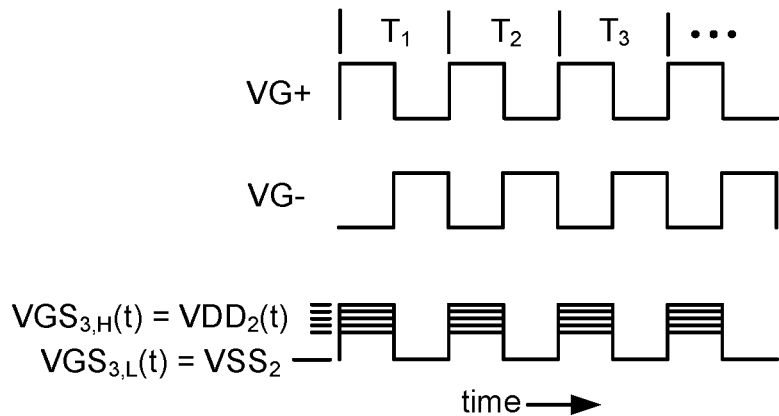
FIG. 15 is a signal diagram showing the switch drive signals VG+, VG−, and $VGS_3(t)$ applied to the second and third SMPA stages of the exemplary multi-stage RFPA depicted in FIG. 14.

According to one embodiment of invention, one or more of the SMPA stages SMPA1, SMPA2, and SMPA3 is/are constructed similar to as described in U.S. Pat. No. 9,397,621 to McCune, Jr., which is incorporated herein by reference. FIG. 14 is a simplified schematic drawing illustrating how the second stage SMPA2 of the multi-stage RFPA 400 can be configured in relation to the final/output stage SMPA3, when constructed according to the teachings of the McCune, Jr. patent. (Note that the signal conditioning and pre-driver stages discussed in the McCune, Jr. patent have been omitted from FIG. 14, in order to simplify illustration.) The second/driver SMPA stage SMPA2 has a totem pole architecture, comprised of first and second driver FETs 1402 and 1404, and operates in a totem-pole fashion to switch a power FET 1406 in the SMPA3 output stage between compressed (ON) and cut-off (OFF) states, similar to as described above. Due to the direct coupling, $VGS_{3,H}(t)$=$VDD_2(t)$ and $VGS_{3,L}(t)$=$VSS_2(t)$, as shown in the signal diagram in FIG. 15. Since $VGS_{3,H}(t)$ is determined by $VDD_2(t)$, $VDD_2(t)$ can be controlled so that $VGS_{3,H}$ tracks the deep triode/triode region boundary (see FIG. 13) and falls just inside the deep triode region for all values of $VDD_3$, i.e., for each corresponding load line. This same approach can be repeated, in real time, i.e., dynamically, for each change in $VDD_3$ and for each corresponding $VDD_3$-dependent load line. Further, since $VDD_2(t)$=$VGS_{3,H}(t)$ and $VDD_1(t)$=$VGS_{2,H}(t)$, a similar approach may be used to determine, control and minimize $VGS_{2,H}(t)$ and $VGS_{1,H}(t)$ and thereby minimize VGS feedthrough through the parasitic gate-drain capacitors $C_{gd2}$ and $C_{gd1}$ of SMPA stages SMPA2 and SMPA1. Minimizing the magnitude of $VGS_{3,H}$ for each $VDD_3$-dependent load line, and doing the same for the drive voltage $VGS_{2,H}$ and $VGS_{1,H}$ guarantees that: 1) the SMPAs: SMPA1, SMPA2 and SMPA3 always operate as switches (i.e., always operate in switch mode); 2) the SMPAs are not unnecessarily overdriven; and 3) amplitude- and phase-distortion due to VGS feedthrough is minimized to the extent possible.

Figure 16:
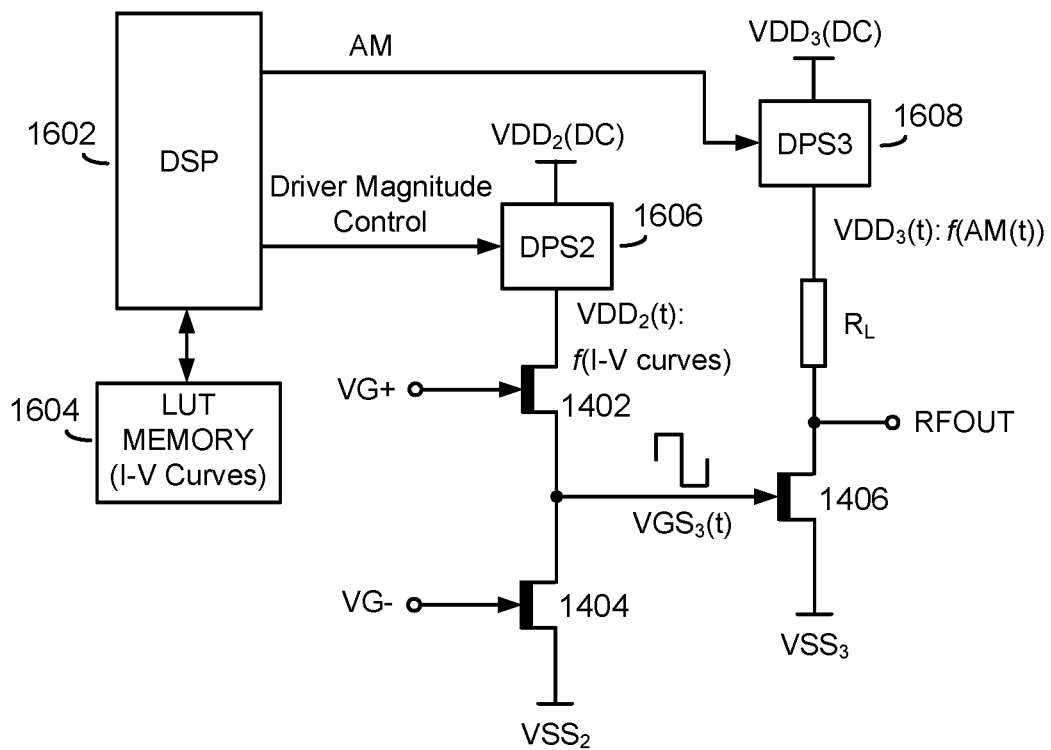
FIG. 16 is a drawing showing the control apparatus used to dynamically control the magnitude of the RF switch drive signal $VGS_3(t)$ in the multi-stage RFPA apparatus depicted in FIG. 14, in accordance with one embodiment of the invention.

FIG. 16 is a drawing illustrating the control apparatus used to dynamically control the magnitude of the RF switch drive signal $VGS_3(t)$ in the multi-stage RFPA apparatus 1400 depicted in FIG. 14, according to one embodiment of the invention. The control apparatus includes a digital signal processor (DSP) 1602, a lookup table (LUT) memory 1604 configured to store I-V characteristic curve data of the output stage SMPA3; a driver stage dynamic power supply 1606 ("DPS2"); and an output stage dynamic power supply 1608 ("DPS3"). The DSP 1602 is configured to generate an amplitude modulation (AM) signal; a driver magnitude control signal; and a phase modulation (PM) signal. The AM signal is applied to a control input of the output stage dynamic power supply 1608, which responds by generating the DPS voltage $VDD_3(t)$ for the power FET 1406 in the output switching stage SMPA3. The final RF output is thus amplitude modulated with the AM signal envelope carried by the DPS voltage $VDD_3(t)$.

The driver stage DPS voltage $VDD_2(t)$ produced by the driver stage dynamic power supply 1606 is controlled by the driver magnitude control signal produced by the DSP 1602 and is a function of the output stage's I-V curves, i.e., $VDD_2(t): f(\text{I-V curves})$. (Compare to the output stage DPS voltage $VDD_3(t)$, which instead is a function of the AM, i.e., $VDD_3(t): f(AM(t))$.) The DSP 1602 controls the driver magnitude control signal applied to the driver stage DPS 1606 so that the output stage SMPA3 always maintains switch-mode operation. It also operates to minimize the magnitude of the driver dynamic power supply voltage $VDD_2(t)$, using I-V characteristic curve data stored in the LUT memory 1604, so that the high drive level $VGS_{3,H}(t)$ of the RF switch drive signal $VGS_3(t)$ minimizes VGS feedthrough through the output stage parasitic gate-drain capacitor $C_{gd3}$. As was explained above, the magnitude of $VDD_2(t)$ establishes the magnitude of the high drive level $VGS_{3,H}(t)$ of the RF switch drive signal $VGS_3(t)$. Accordingly, by minimizing $VDD_2(t)$, $VGS_{3,H}(t)$ is also minimized. The DSP 1602 also operates to adjust the magnitude of $VDD_2(t)$ and the high drive level $VGS_{3,H}(t)$ dynamically, in other words, for each change in the output stage's SMP3's load line. More specifically, for each given load line, the DSP 1602 selects a VGS curve (or VGS data value) from the I-V characteristic curve data stored in the LUT memory 1604 that both intersects the load line and falls just within the deep triode region of the output stage power FET 1406, as defined by the deep triode/triode region boundary (see FIG. 13 above). The deep triode/triode region boundary can be defined in various ways. For example, in one embodiment of the invention it is defined as being ⅔ the knee voltage $V_K$, i.e., $2V_K/3 = 2 \text{ k} \times (VDS_3)^2/3$. By minimizing $VGS_{3,H}(t)$ for each output stage load line, VGS feedthrough through the output stage's SMPA3's parasitic gate-drain capacitor $C_{gd3}$ is minimized and amplitude and phase distortion in the RF output RFOUT attributable to VGS feedthrough are therefore avoided to the extent possible.

Figure 17:
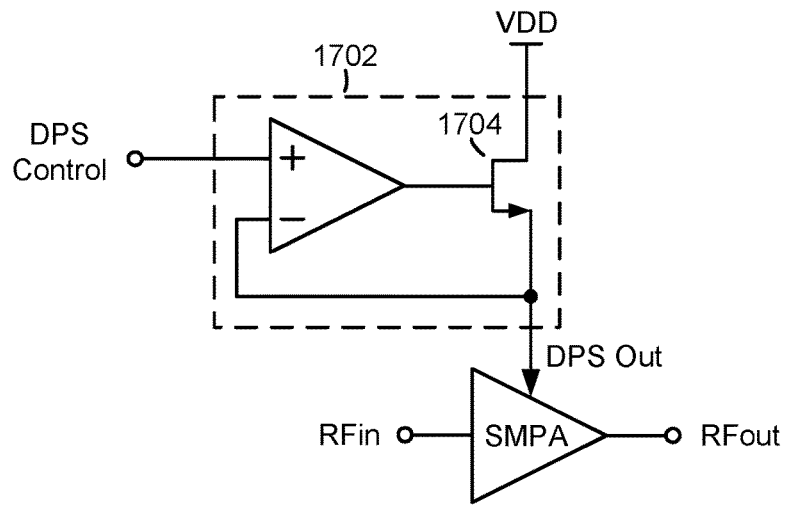
FIG. 17 is a schematic diagram of a linear regulator, which may form the foundation of the driver stage DPS in the driver stage of the multi-stage SMPA apparatus depicted in FIG. 16, the output stage DPS in the output stage of the multi-stage SMPA apparatus depicted in FIG. 16, or both DPSs in both the driver stage and output stage.
Figure 18:
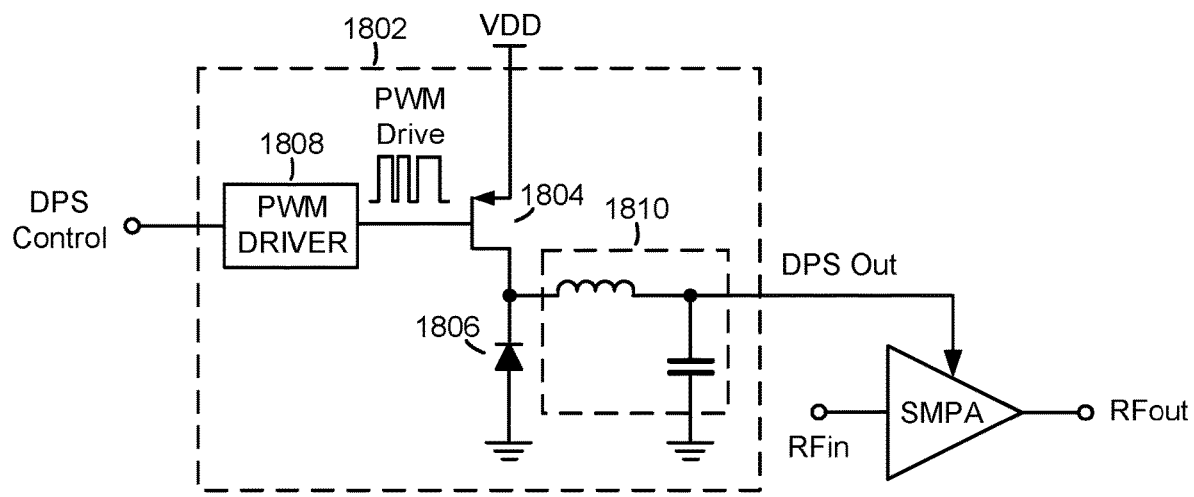
FIG. 18 is a schematic diagram of an exemplary switch-mode power supply (SMPS), which may form the foundation of the driver stage DPS in the driver stage of the multi-stage SMPA apparatus depicted in FIG. 16, the output stage DPS in the output stage of the multi-stage SMPA apparatus depicted in FIG. 16, or both DPSs in both the driver stage and output stage.

The driver stage DPS 1606 and output stage DPS 1608 can be implemented based on a linear regulator type topology (a basic example of which is illustrated in FIG. 17), a switch-mode power supply SMPS (a basic example of which is illustrated in FIG. 18), or a combination of these two fundamental approaches to implementing power supplies. As the name suggests, a linear regulator generates an output signal that is linearly related to its input signal. Accordingly, if the DPS 1702 depicted in FIG. 17 was used as a foundation for implementing the output stage DPS 1608 for the output stage of the multi-stage RFPA apparatus 1600 depicted in FIG. 16, the linear regulator 1702 would generate an envelope modulated power supply signal $VDD_3(t)$ that tracks the envelope of the AM signal applied to the DPS control input. Similarly, if the linear regulator 1702 was used to implement the driver stage DPS 1606, the linear regulator 1702 would respond to the "Driver Magnitude Control signal," which may or may not be an envelope signal and may or may not depend on or relate to the AM used to control the output stage DPS 1608.

One attractive feature of the linear regulator 1702 is that it is fast to react to changes made at the DPS control input. However, a drawback is that the linear regulator 1702 is not very energy efficient, particularly during times when the magnitude of the DPS output voltage VDD(t) is low. Nevertheless, if efficiency is not a primary concern and a fast-reaction DPS is required or desired, the linear regulator 1702 can provide a simple, fast, and low-noise foundation for constructing the driver stage DPS 1606, the output stage DPS 1608, or both. In many applications, however, efficiency is a primary concern. In such cases a DPS design based on a SMPS topology is preferable, for example, an SMPS that employs a Class-S modulator 1802 such as depicted in FIG. 18. The Class-S modulator 1802 includes a transistor 1804 and a diode 1806 which together operate as a two-pole switch and respond to a pulse-width modulation (PWM) switch drive signal generated by a PWM driver 1808. The PWM drive signal has pulses with durations (i.e., "widths") that the PWM driver 1808 controls and varies depending on the magnitude of the a DPS control signal. An output LC filter 1810 filter is then used to recover the desired DPS supply voltage from the switch-mode signal produced at the circuit node formed by the intersection of the cathode of the diode 1806 and drain of the transistor 1804. Further details concerning DPSs can be found in aforementioned E. McCune, *Dynamic Power Supply Transmitters—Envelope Tracking, Direct Polar, and Hybrid Combinations*, Cambridge University Press (2015).

While various embodiments of the present invention have been presented, they have been presented by way of example and not limitation. Those persons skilled in the relevant art will appreciate and understand that various changes in form and detail may be made to the exemplary embodiments of the invention described in the detailed description, without departing from the true spirit and scope of the invention. The scope of the invention should therefore not be restricted to the specifics of the exemplary embodiments of the invention described in the detailed description but instead should be determined by the appended claims, including the full scope of equivalents to which such claims are entitled.

What is claimed is:

1. A multi-stage radio frequency power amplifier (RFPA), comprising:
    an output stage switch-mode power amplifier (SMPA);
    a driver stage SMPA configured to generate an RF switch drive signal that drives the output stage SMPA, the RF switch drive signal having a dynamically adjustable high level; and
    a control circuit configured to dynamically and continuously adjust the high level of the RF switch drive signal to minimize parasitic feedthrough of the RF switch drive signal from an RF input of the output stage SMPA to an RF output of the output stage SMPA, and control the high level of the RF switch drive signal so that the output stage SMPA never loses switch-mode operation.

2. The multi-stage RFPA of claim 1, wherein the control circuit is configured to dynamically and continuously adjust and control the high level of the RF switch drive signal depending on current-voltage (I-V) characteristics of a power transistor in the output stage SMPA and a dynamically changing load line of the output stage SMPA.

3. The multi-stage RFPA of claim 1, wherein the control circuit comprises a dynamic power supply (DPS) that supplies a dynamic power supply voltage to a power supply port of the driver stage SMPA, and the high level of the RF switch drive signal generated by the driver stage SMPA varies dynamically depending on the dynamic power supply voltage.

4. The multi-stage RFPA of claim 3, wherein the control circuit and its DPS control the high level of the RF switch drive signal depending on current-voltage (I-V) characteristics of a power transistor in the output stage SMPA and a dynamically changing load line of the output stage SMPA.

5. The multi-stage RFPA of claim 1, wherein the control circuit is configured to receive an input amplitude modulation (AM) signal, the output stage SMPA includes a power transistor, and the control circuit comprises a digital signal processor (DSP) configured to control the high level of the RF switch drive signal depending on current-voltage (I-V) characteristics of the power transistor and a dynamically changing load line of the output stage SMPA, and the RF switch drive signal is not modulated by the input AM signal.

6. The multi-stage RFPA of claim 5, wherein the control circuit further comprises a lookup table (LUT) memory accessible by the DSP and configured to store I-V characteristic data of the power transistor of the output stage SMPA.

7. The multi-stage RFPA of claim 1, wherein the control circuit further comprises a first dynamic power supply (DPS) that generates and supplies a first dynamic power supply voltage to the driver stage SMPA, and the driver stage SMPA comprises a totem pole driver that dynamically adjusts the high level of the RF switch drive signal depending on the first dynamic power supply voltage.

8. The multi-stage RFPA of claim 7, further comprising:
a second DPS that generates and supplies a second dynamic power supply voltage to the output stage SMPA; and
a digital signal processor (DSP) configured to control the second DPS so that the second dynamic power supply voltage tracks amplitude modulation (AM) in an input amplitude modulated signal;
wherein the output stage SMPA includes a power transistor and the DSP is further configured to direct the first DPS to adjust the high level of the RF switch drive signal depending on current-voltage (I-V) characteristics of the power transistor in the output stage SMPA and a dynamically changing load line of the output stage SMPA.

9. The multi-stage RFPA of claim 8, wherein the control circuit further comprises a lookup table (LUT) memory accessible by the DSP and configured to store I-V characteristic data of the power transistor of the output stage SMPA.

10. The multi-stage RFPA of claim 9, wherein the I-V characteristic data stored in the LUT memory includes a plurality of gate-source voltage values, and the control circuit is configured to dynamically select different gate-source voltage values from the plurality of gate-source voltage values that intersect with the dynamically changing load line as the dynamically changing load line changes.

11. The method of claim 8, wherein the I-V characteristics of the power transistor include a triode region and a deep triode region, and the control circuit is configured to control the first DPS so that the high level of the RF switch drive signal dynamically tracks a gate-source voltage boundary between the triode and deep triode regions.

12. A method of driving an output stage of a multi-stage switch-mode power amplifier (SMPA), comprising:
generating a radio frequency (RF) switch drive signal having a dynamically adjustable high level;
applying the RF switch drive signal to an RF input of the output stage of the multi-stage SMPA, the output stage configured to always operate in switch mode;
generating an output-stage dynamic power supply (DPS) voltage that tracks a signal envelope of an input amplitude modulated (AM) signal;
applying the output-stage DPS voltage to a power supply port of the output stage of the multi-stage SMPA;
minimizing parasitic feedthrough of the RF switch drive signal from an RF input of the output stage to an RF output of the output stage,
wherein minimizing parasitic feedthrough of the RF switch drive signal includes dynamically and continuously adjusting the high level of the RF switch drive signal so that the output stage of the multi-stage SMPA never loses switch-mode operation.

13. The method of claim 12, wherein minimizing parasitic feedthrough of the RF switch drive signal comprises dynamically minimizing the high level of the RF switch drive signal depending on current-voltage (I-V) characteristics of a power transistor in the output stage of the multi-stage SMPA and a dynamically changing load line of the output stage.

14. The method of claim 13, wherein dynamically minimizing the high level of the RF switch drive signal comprises dynamically selecting gate-source voltage values from the I-V characteristics of the power transistor that intersect with the dynamically changing load line and that fall within the deep triode region of the I-V characteristics.

15. The method of claim 13, wherein dynamically minimizing the high level of the RF switch drive signal comprises dynamically selecting gate-source voltage values from the I-V characteristics of the power transistor that intersect with the dynamically changing load line and that track a triode/deep triode boundary in the I-V characteristics.

16. The method of claim 12, further comprising:
generating a driver-stage DPS voltage;
applying the driver-stage DPS voltage to a power supply port of a driver stage of the multi-stage SMPA, the driver stage configured to drive the output stage and always operate in switch mode;
wherein the driver stage comprises a totem-pole driver and the high level of the RF switch drive signal is determined by and dynamically varies depending on the magnitude of the driver-stage DPS voltage.

17. The method of claim 16, wherein the RF switch drive signal is not modulated by the input AM signal, and minimizing parasitic feedthrough of the RF switch drive signal comprises dynamically controlling the driver-stage DPS voltage and the high level of the RF switch drive signal depending on current-voltage (I-V) characteristics of a power transistor in the output stage and a dynamically changing load line of the output stage.

18. The method of claim 17, wherein minimizing parasitic feedthrough of the RF switch drive signal comprises:
retrieving I-V characteristic data characterizing the power transistor of the output stage from a lookup table (LUT); and
using the retrieved I-V characteristic data to minimize the parasitic feedthrough of the RF switch drive signal from the RF input of the output stage to the RF output of the output stage.

* * * * *